(12) United States Patent
Cho et al.

(10) Patent No.: US 11,183,363 B2
(45) Date of Patent: Nov. 23, 2021

(54) SCANNING ELECTRON MICROSCOPE APPARATUS AND OPERATION METHOD THEREOF

(71) Applicant: Samsung Electronics Co., Ltd., Suwon-si (KR)

(72) Inventors: Yongmin Cho, Suwon-si (KR); Taeyong Lee, Hwaseong-si (KR); Sangkyo Lim, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 11 days.

(21) Appl. No.: 16/821,249

(22) Filed: Mar. 17, 2020

(65) Prior Publication Data

US 2021/0066034 A1   Mar. 4, 2021

(30) Foreign Application Priority Data

Sep. 3, 2019   (KR) .......................... 10-2019-0108661

(51) Int. Cl.
| | | |
|---|---|---|
| *H01J 37/28* | (2006.01) | |
| *H01J 37/244* | (2006.01) | |
| *H01J 37/22* | (2006.01) | |
| *H01J 37/21* | (2006.01) | |
| *H01J 37/20* | (2006.01) | |

(52) U.S. Cl.
CPC .............. *H01J 37/28* (2013.01); *H01J 37/20* (2013.01); *H01J 37/21* (2013.01); *H01J 37/222* (2013.01); *H01J 37/244* (2013.01)

(58) Field of Classification Search
CPC .......... H01J 37/28; H01J 37/244; H01J 37/21; H01J 37/222; H01J 37/20; H01J 2237/20; H01J 2237/2815; H01J 2237/2826; H01J 37/147; H01J 37/10
See application file for complete search history.

(56) References Cited

U.S. PATENT DOCUMENTS

| | | | | |
|---|---|---|---|---|
| 4,788,431 A | * | 11/1988 | Eckes ..................... | H01J 37/20 250/397 |
| 5,528,047 A | * | 6/1996 | Nakajima ............ | H01J 37/3045 250/491.1 |
| 6,531,786 B1 | * | 3/2003 | Yahiro .................. | G03F 9/7076 257/797 |
| 6,825,480 B1 | * | 11/2004 | Watanabe ............ | G01R 31/307 250/310 |
| 7,105,843 B1 | * | 9/2006 | Pearl ..................... | H01J 37/304 250/492.2 |
| 7,428,328 B2 | | 9/2008 | Jee et al. | |
| 8,059,280 B2 | | 11/2011 | Fisher et al. | |
| (Continued) | | | | |

FOREIGN PATENT DOCUMENTS

| | | |
|---|---|---|
| KR | 10-2018-0130049 A | 12/2018 |
| KR | 10-2019-0000056 A | 1/2019 |

*Primary Examiner* — David A Vanore
(74) *Attorney, Agent, or Firm* — Harness, Dickey & Pierce, P.L.C.

(57) ABSTRACT

A scanning electron microscope apparatus including an electron gun configured to generate an electron beam, a focusing lens configured to concentrate the electron beam from the electron gun, an electron detector configured to detect signals emitted from a sample in response to the electron beam incident on the sample, a stage configured to receive the sample thereon, and a focus calibration structure on an upper part of the stage.

19 Claims, 12 Drawing Sheets

(56) References Cited

U.S. PATENT DOCUMENTS

| | | | |
|---|---|---|---|
| 8,597,565 B2 | 12/2013 | Faber et al. | |
| 8,604,427 B2 | 12/2013 | Schwarzband et al. | |
| 9,659,743 B2 | 5/2017 | Kim et al. | |
| 9,852,881 B2* | 12/2017 | Shishido | G01B 15/04 |
| 2007/0008534 A1* | 1/2007 | Lo | G11C 17/143 |
| | | | 356/401 |
| 2009/0296073 A1 | 12/2009 | Wagganer | |
| 2011/0133065 A1* | 6/2011 | Nakayama | H01J 37/28 |
| | | | 250/252.1 |
| 2011/0295555 A1* | 12/2011 | Meessen | G03F 7/705 |
| | | | 702/179 |
| 2012/0223227 A1 | 9/2012 | Chen et al. | |
| 2016/0261786 A1 | 9/2016 | Ahn et al. | |
| 2018/0103247 A1 | 4/2018 | Kolchin et al. | |
| 2018/0218878 A1 | 8/2018 | Xu et al. | |
| 2019/0019651 A1* | 1/2019 | Maruyama | H01J 37/21 |
| 2019/0393014 A1* | 12/2019 | Kawamoto | H01J 37/222 |
| 2021/0066034 A1* | 3/2021 | Cho | H01J 37/244 |

* cited by examiner

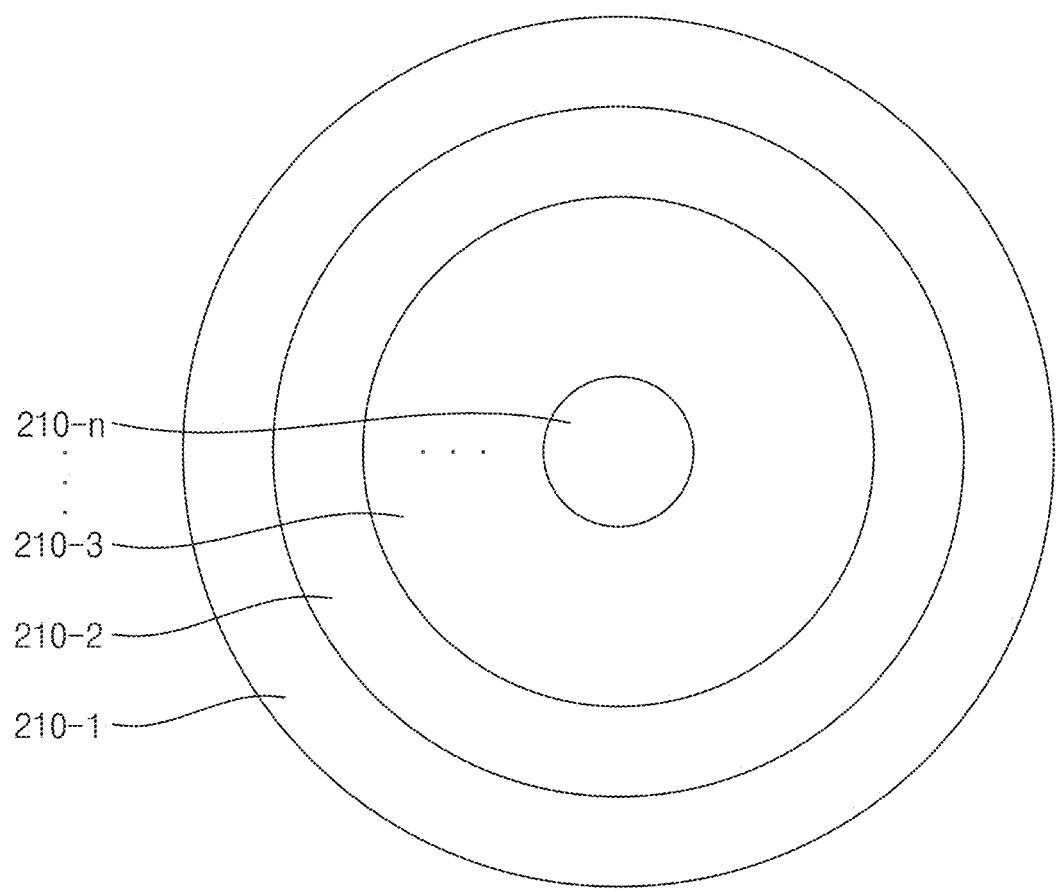

SCANNING ELECTRON MICROSCOPE APPARATUS AND OPERATION METHOD THEREOF

CROSS-REFERENCE TO RELATED APPLICATION

This application claims priority under 35 U.S.C. § 119 to Korean Patent Application No. 10-2019-0108661, filed on Sep. 3, 2019 in the Korean Intellectual Property Office, the disclosure of which is incorporated herein by reference.

BACKGROUND

1. Field

The present disclosure relates to scanning electron microscope apparatuses and/or operation methods thereof.

2. Description of Related Art

Various sources may be used to measure the structure of a semiconductor device. For example, the various sources may include light, X-rays, sound waves, ultrasonic waves, or electrons. One of the popular sources may be electrons. For example, the structure of a semiconductor device may be measured using an electron microscope apparatus, which uses electrons as a source. In particular, in the field of two-dimensional (2D) structure measurement, a scanning electron microscope (SEM) apparatus has been widely used. The scanning electron microscope has been used in semiconductor manufacturers and laboratories.

SUMMARY

Example embodiments of the present disclosure provide scanning electron microscope apparatuses and/or operation methods thereof for analyzing a 3D structure.

However, objects to be accomplished by the present disclosure are not limited to the above-mentioned objects, and other objects not mentioned will be clearly understood by those skilled in the art from the following description.

According to an example embodiment of the present disclosure, a scanning electron microscope apparatus includes an electron gun configured to generate an electron beam, a focusing lens configured to concentrate the electron beam from the electron gun, an electron detector configured to detect signals emitted from a sample in response to the electron beam incident on the sample, a stage configured to receive the sample thereon, and a focus calibration structure on an upper part of the stage.

According to an example embodiment of the present disclosure, a scanning electron microscope apparatus includes an electron gun configured to generate an electron beam, a focusing lens configured to concentrate the electron beam from the electron gun, an electron detector configured to detect signals emitted from a sample in response to the electron beam incident on a sample, a stage configured to receive the sample thereon, a support layer on an upper surface of the stage, and a focus calibration structure on an upper surface of the support layer.

According to an example embodiment of the present disclosure, an operation method of a scanning electron microscope apparatus includes scanning an electron beam to a focus calibration part disposed on an upper surface of a stage, and determining at least one acceleration voltage value for focusing the electron beam on an upper surface of at least one of upper surfaces of a plurality of layers of the focus calibration part.

BRIEF DESCRIPTION OF THE DRAWINGS

The above and other objects, features and other advantages of the present disclosure will be more clearly understood from the following detailed description taken in conjunction with the accompanying drawings, in which:

FIGS. 5A to 5C are schematic diagrams illustrating a focus calibration part having a pyramid shape according to some example embodiments of the present disclosure.

DETAILED DESCRIPTION

While the term "same" or "identical" is used in description of example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values are modified as "about" or "substantially," it will be understood that these values should be construed as including a manufacturing or operational tolerance (e.g., ±10%) around the stated numerical values.

Figure 1:
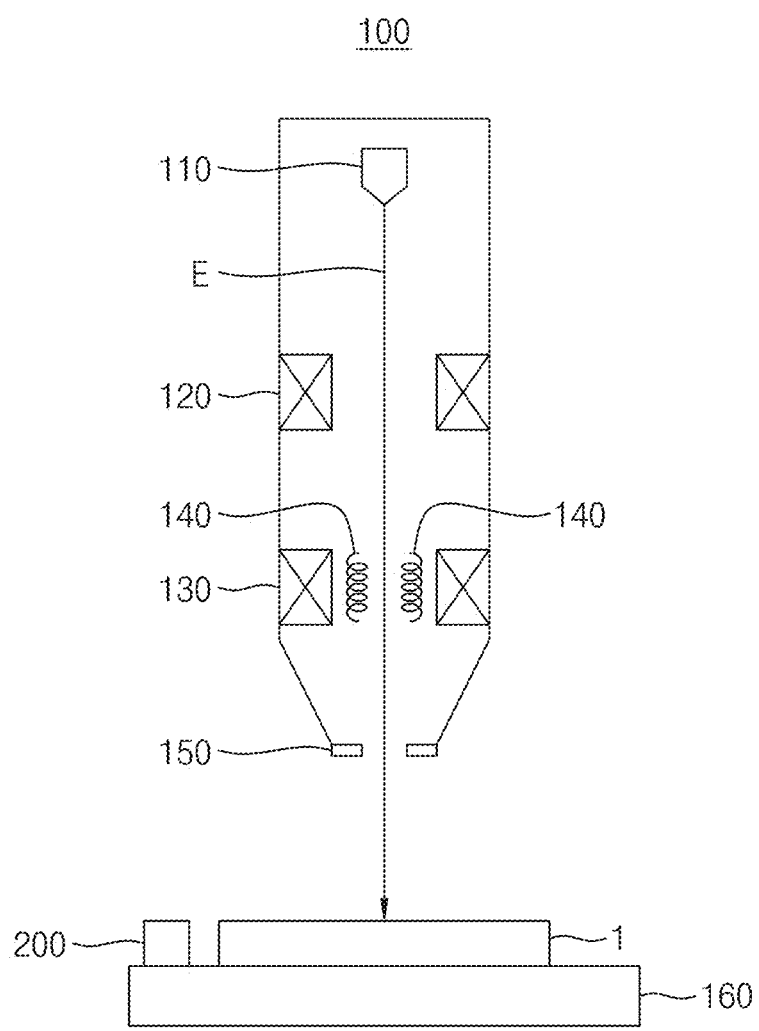
FIG. 1 is a schematic diagram illustrating a scanning electron microscope according to an example embodiment of the present disclosure.

FIG. 1 is a schematic diagram illustrating a scanning electron microscope 100 according to an example embodiment of the present disclosure.

Referring to FIG. 1, the scanning electron microscope 100 may include an electron gun 110, a condenser lens 120, a focusing lens 130, a scanning coil 140, an electron detector 150, a stage 160, and a focus calibration structure 200. A sample 1 may be positioned on an upper surface of the stage 160.

The electron gun 110 may generate an electron beam E for scanning the sample 1. The electron gun 110 may generate electrons to generate the electron beam E. The electron gun 110 may apply a voltage to the generated electrons to accelerate the electron beam E.

The condenser lens 120 may also be referred to as a concentration lens. The condenser lens 120 may concentrate the electron beam E, which has been generated and accelerated by the electron gun 110, on a relatively small spot of the sample 1.

The focusing lens 130 may also be referred to as an object lens. The focusing lens 130 may concentrate the electron beam E through the condenser lens 120, on the sample 1. For example, the focusing lens 130 may determine the diameter of the electron beam E incident (or alternatively, scanned) on the sample 1. The focusing lens 130 may adjust the diameter of the electron beam E to adjust the magnification of a sample image.

The scanning coil 140 may adjust a scan angle and a scan direction of the electron beam E. For example, when current is applied to the scanning coil 140, the electron beam E may be bent. The scanning coil 140 may adjust the degree by which the electron beam E is bent depending on the amplitude of the applied current.

The electron detector 150 may detect various signals emitted from the sample 1 through the electron beam E incident (or alternatively, scanned) on the sample 1. For example, the various signals may include secondary electrons (SEs) and back scattered electrons (BSEs).

Figure 2:
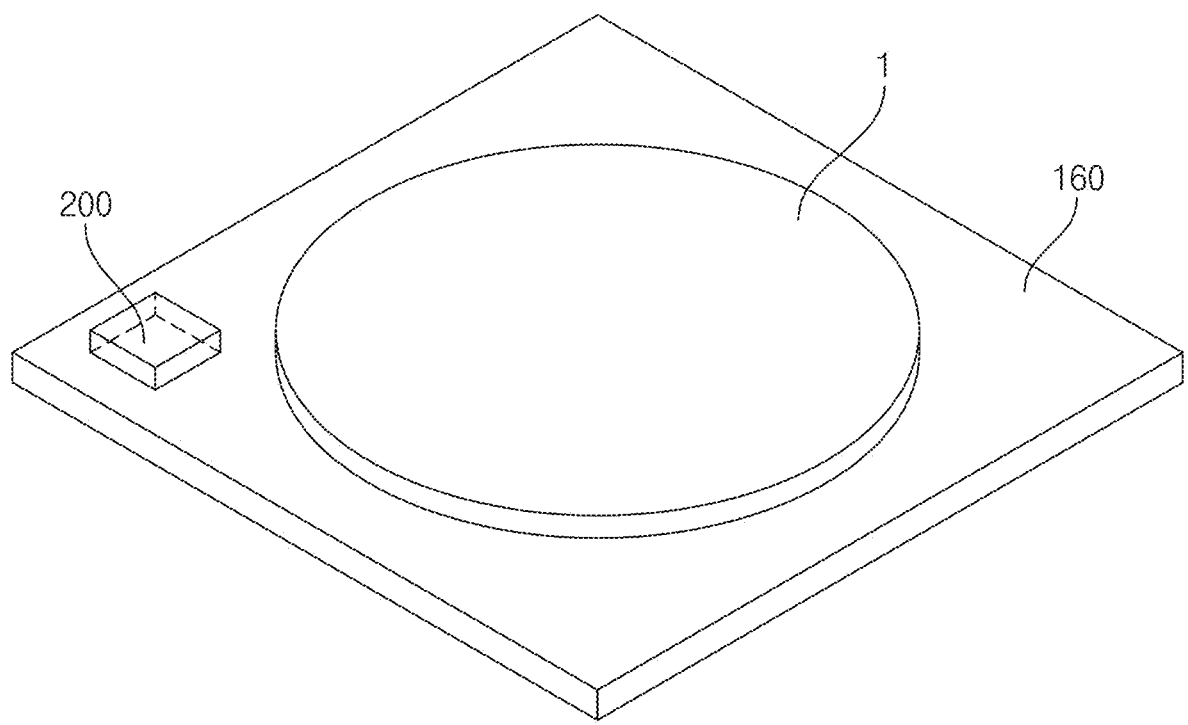
FIG. 2 is a schematic diagram illustrating the stage 160 having the sample and the focus calibration structure thereon, according to an example embodiment of the present disclosure.

FIG. 2 is a schematic diagram illustrating the stage 160 having the sample 1 and the focus calibration structure 200 thereon according to an example embodiment of the present disclosure.

Referring to FIG. 2, the sample 1 and the focus calibration structure 200 may be disposed on the upper surface of the stage 160. The focus calibration structure 200 may be configured to calibrate a focus of the electron beam E. A region of the upper surface of the stage 160, on which the sample 1 is positioned, may be referred to as a sample region. A region of the upper surface of the stage 160, on which the focus calibration structure 200 is disposed, may be referred to as a calibration region.

Figure 3A:
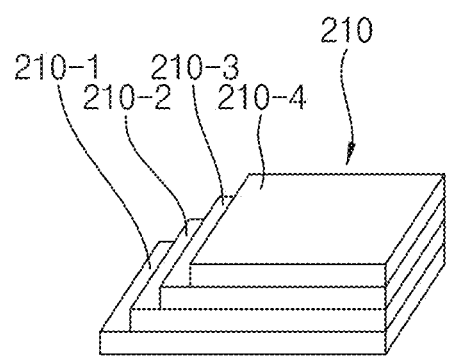
FIGS. 3A and 3B are schematic diagrams illustrating a focus calibration structure having a staircase shape according to some example embodiments of the present disclosure.
Figure 3B:
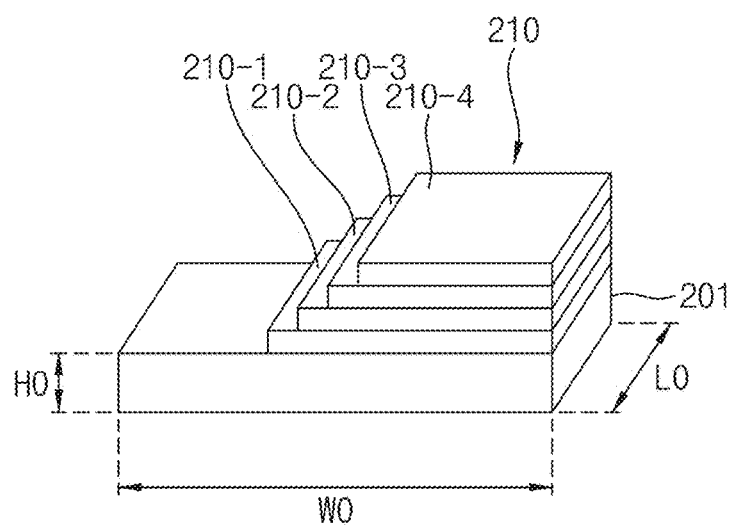

FIGS. 3A and 3B are schematic diagrams illustrating a focus calibration structure 200 having a staircase shape according to some example embodiments of the present disclosure.

Referring to FIG. 3A, the focus calibration structure 200 may include a focus calibration part 210. The focus calibration part 210 may include a plurality of layers 210-1 to 210-4. According to various example embodiments of the present disclosure, the plurality of layers of the focus calibration part 210 may have various heights, respectively.

In some example embodiments, the respective heights of the plurality of layers may be the same. In some example embodiments, the respective heights of the plurality of layers may be different from one another. In some example embodiments, the respective heights of the plurality of layers may be various, independently.

Referring to FIG. 3B, the focus calibration structure 200 may further include a support layer 201. The height H0 of the support layer 201 may change depending on the thickness of the sample 1. For example, the sample 1 may be a silicon wafer with a semiconductor pattern formed thereon. In this case, the height H0 of the support layer 201 may be the same as the height of the silicon wafer.

According to various example embodiments of the present disclosure, the focus calibration part 210 may have various shapes.

Figure 4A:
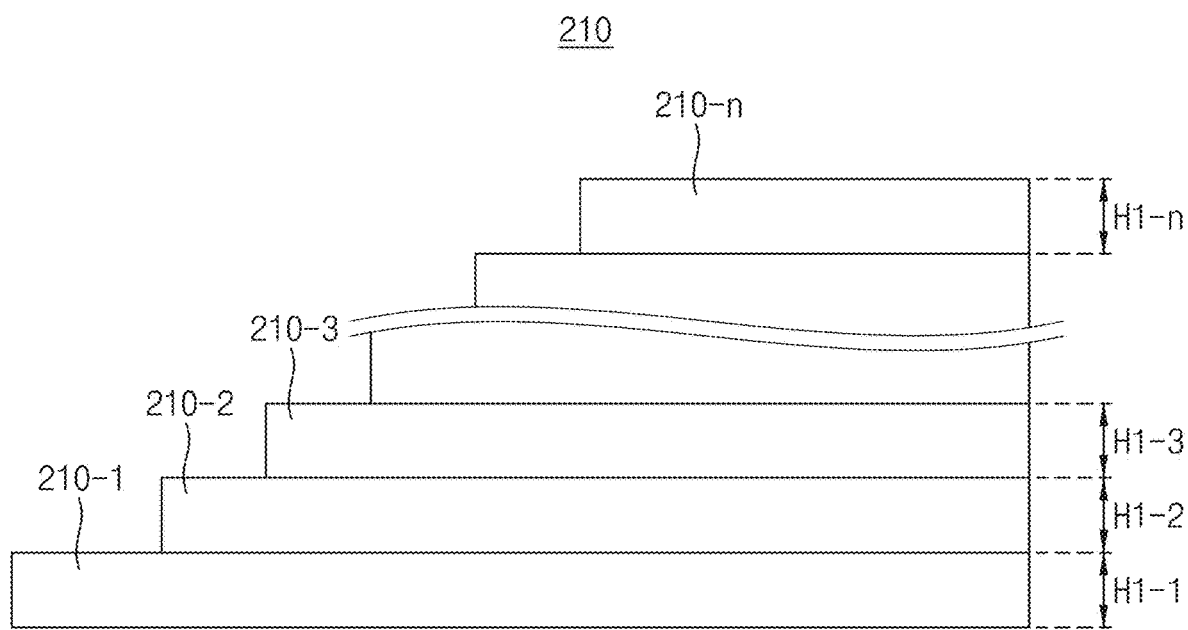
FIGS. 4A to 4C are schematic diagrams illustrating a focus calibration part having a staircase shape according to some example embodiments of the present disclosure.
Figure 4B:
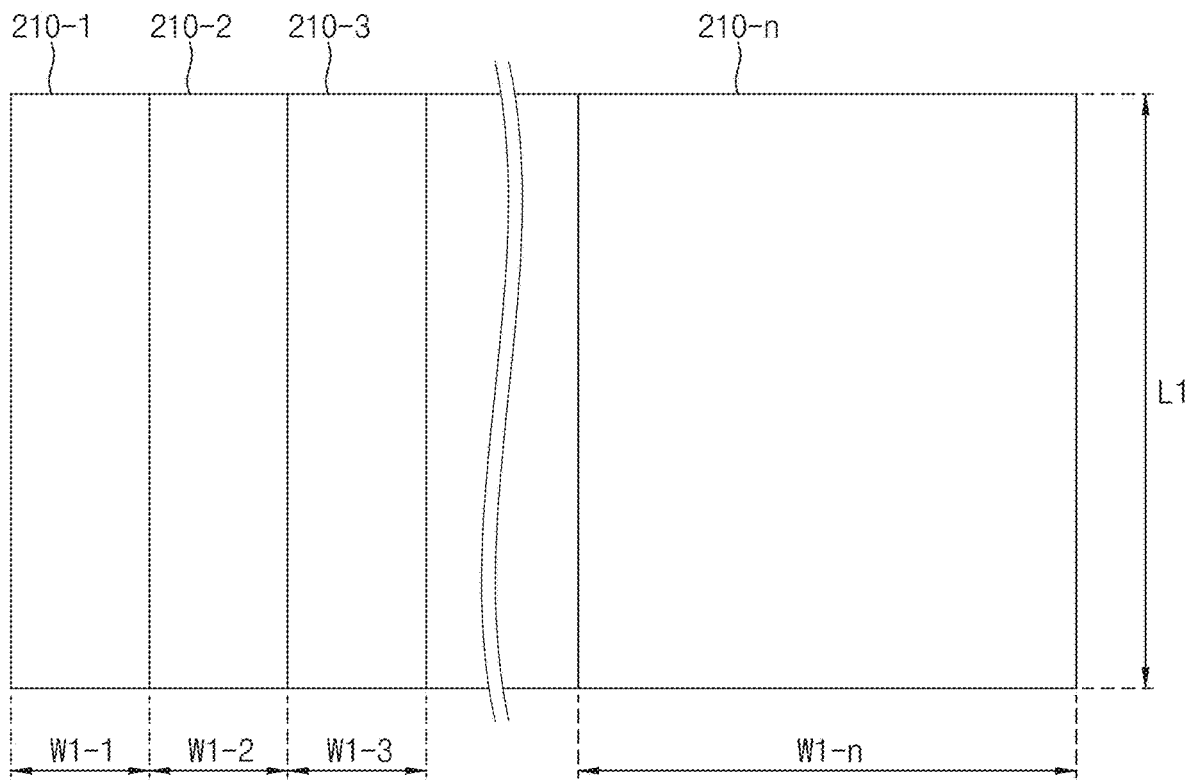
Figure 4C:
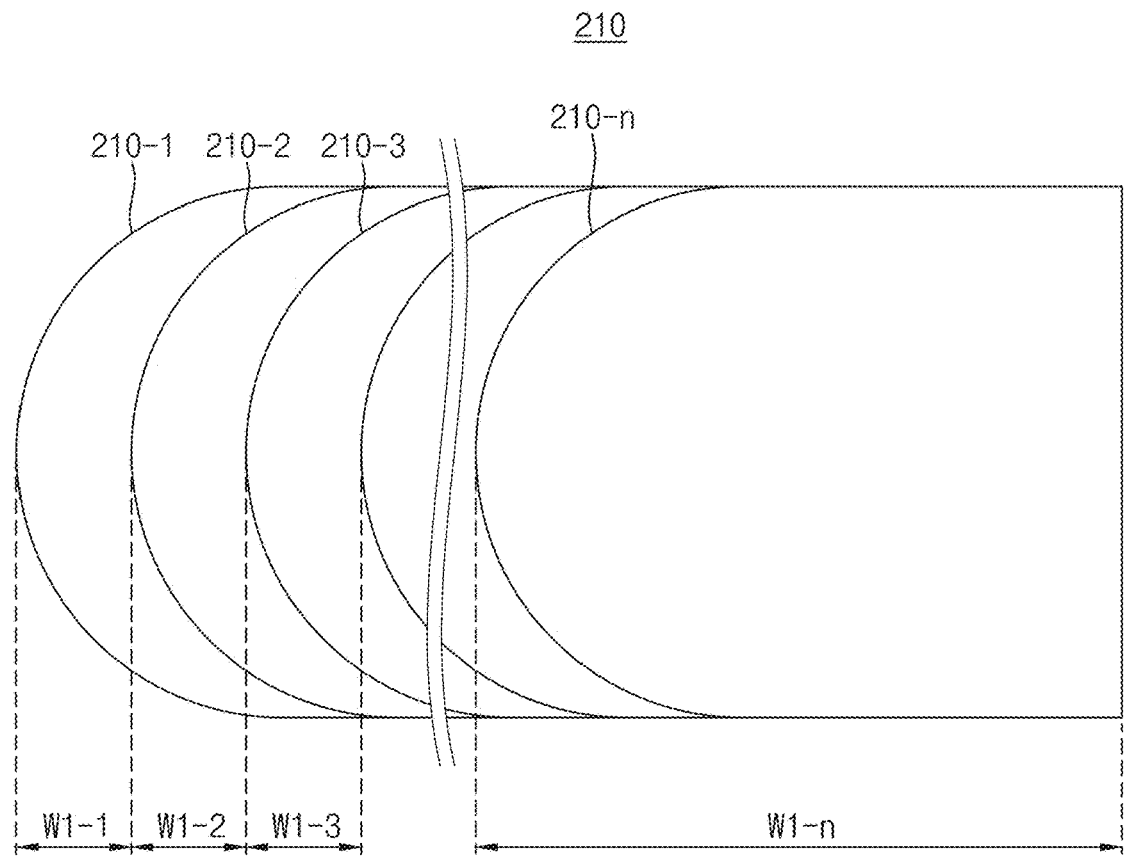

FIGS. 4A to 4C are schematic diagrams illustrating a focus calibration part having a staircase shape according to some example embodiments of the present disclosure.

FIG. 4A is a side view of the focus calibration part 210 according to an example embodiment of the present disclosure. Referring to FIG. 4A, the focus calibration part 210 may include a first layer 210-1 to an nth layer 210-$n$. The respective heights H1-1 to H1-$n$ of a plurality of layers 210-1 to 210-$n$ may be the same. The height H1-1 of the first layer 210-1 to the height H1-$n$ of the nth layer 210-$n$ are not limited thereto, and may vary in some example embodiments of the present disclosure.

FIG. 4B is a top view of the focus calibration part 210 according to an example embodiment of the present disclosure. Referring to FIG. 4B, the focus calibration part 210 may have a staircase shape with a square upper surface.

For example, a second layer 210-2 may be disposed on an upper surface of the first layer 210-1 to expose a portion of the surface having a first horizontal width W1-1. A third layer 210-3 may be disposed on an upper surface of the second layer 210-2 to expose a portion of a surface having a second horizontal width W1-2. A fourth layer 210-4 may be disposed on an upper surface of the third layer 210-3 to expose a portion of the surface having a third horizontal width W1-3. An upper surface of the nth layer 210-$n$ may be entirely exposed.

The horizontal width W1-1 of a first upper surface to a horizontal width W1-(n-1) of an (n-1)th upper surface may be the same. I some example embodiments, an exposed portion of each of the horizontal width W1-1 of the first upper surface through a horizontal width W1-(n-1) of the (n-1)th upper surface may be different from a horizontal width W1-$n$ of an nth upper surface.

The respective vertical lengths L1 of the plurality of layers 210-1 to 210-$n$ of the focus calibration part 210 may be the same. In some example embodiments, the respective vertical lengths of the plurality of layers 210-1 to 210-$n$ of the focus calibration part 210 may be different from one another.

FIG. 4C is a top view of the focus calibration part 210 according to an example embodiment of the present disclosure. Referring to FIG. 4C, the focus calibration part 210 may have a staircase shape in which an upper surface of each of the plurality of layers 210-1 to 210-$n$ of the focus calibration part 210 is partially circular or semicircular. In some example embodiments, an upper surface of each of the plurality of layers 210-1 to 210-$n$ of the focus calibration part 210 may have a curved or rounded surface, for example, at one side.

Figure 5A:
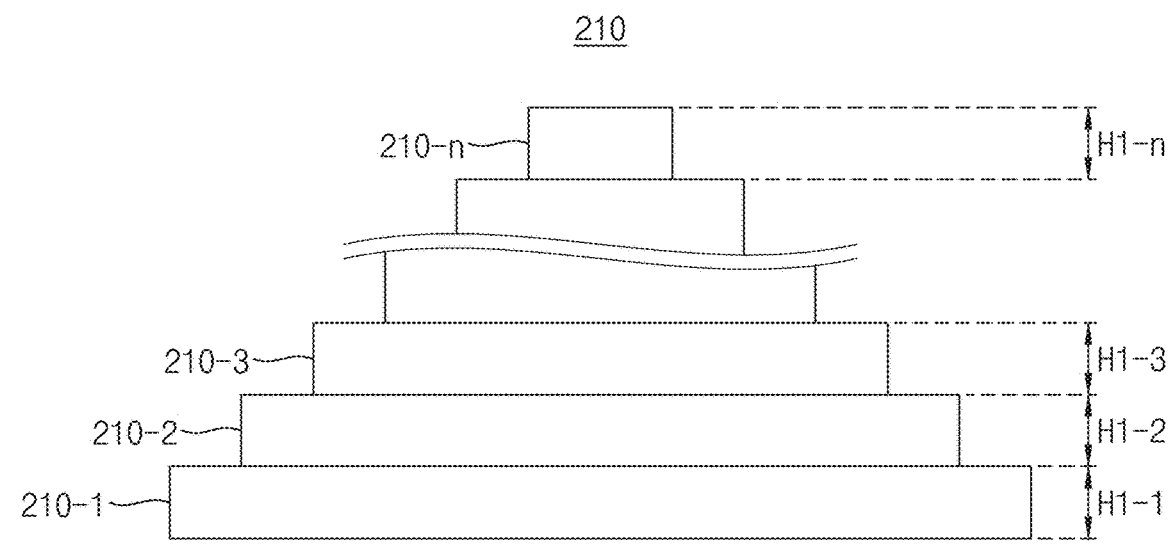
Figure 5B:
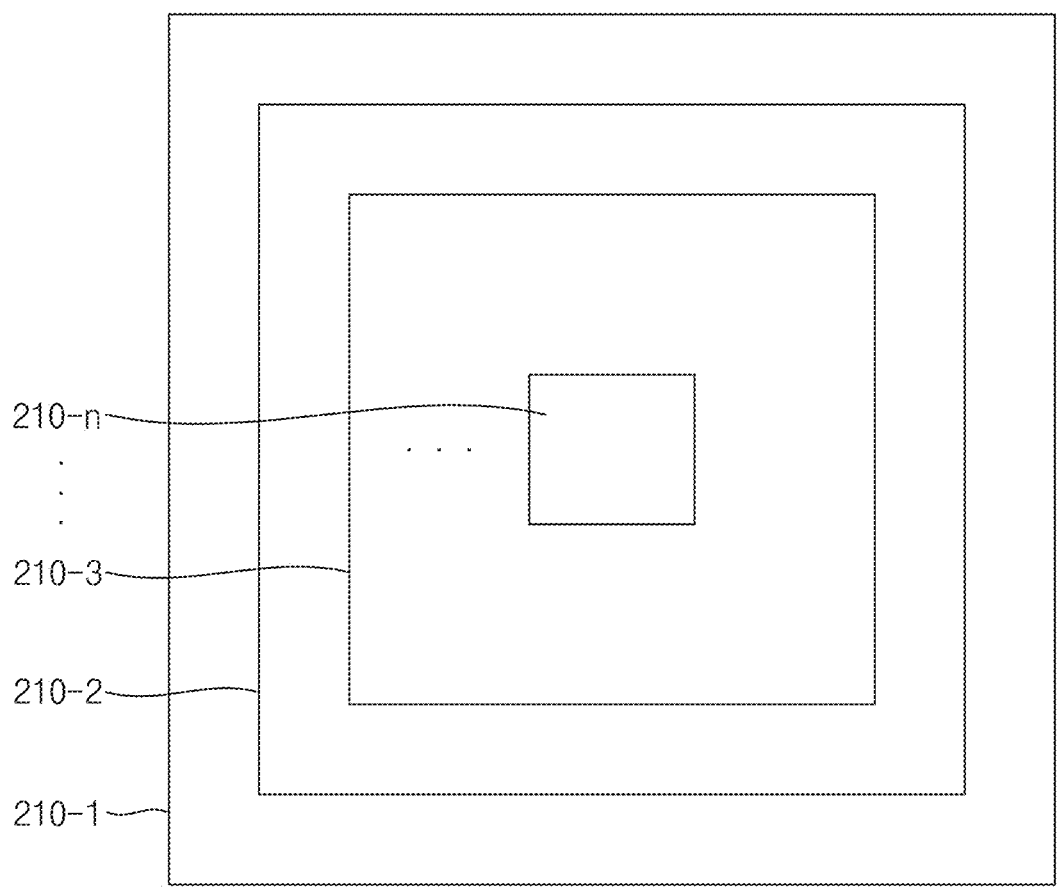

FIGS. 5A to 5C are schematic diagrams illustrating a focus calibration part having a pyramid shape according to some example embodiments of the present disclosure.

FIG. 5A is a side view of the focus calibration part 210 according to an example embodiment of the present disclosure. Referring to FIG. 5A, the focus calibration part 210 may have a pyramid shape. For example, the width of each of the plurality of layers 210-1 to 210-n of the focus calibration part 210 may be reduced from a lower layer toward an upper layer. For example, the width of the second layer 210-2 may be smaller than the width of the first layer 210-1. The width of the third layer 210-3 may be smaller than the width of the second layer 210-2. The width of the nth layer 210-n may be smaller than the width of the (n−1)th layer 210-n−1.

The respective heights H1-1 to H1-n of the plurality of layers 210-1 to 210-n of the focus calibration part 210 may be the same. In some example embodiments, the respective heights H1-1 to H1-n of the plurality of layers 210-1 to 210-n of the focus calibration part 210 may be different from one another.

FIG. 5B is a top view of the focus calibration part 210 according to an example embodiment of the present disclosure. Referring to FIG. 5B, the respective upper surfaces of the plurality of layers 210-1 to 210-n of the focus calibration part 210 may be a square shape having different sizes. The plurality of layers 210-1 to 210-n may be a hexahedral mesa shape having different sizes.

FIG. 5C is a top view of the focus calibration part 210 according to an example embodiment of the present disclosure. Referring to FIG. 5C, respective upper surfaces of the plurality of layers 210-1 to 210-n of the focus calibration part 210 may be a circular shape having different sizes. The plurality of layers 210-1 to 210-n may be a circular mesa (or pillar) shape having different sizes.

Figure 6A:
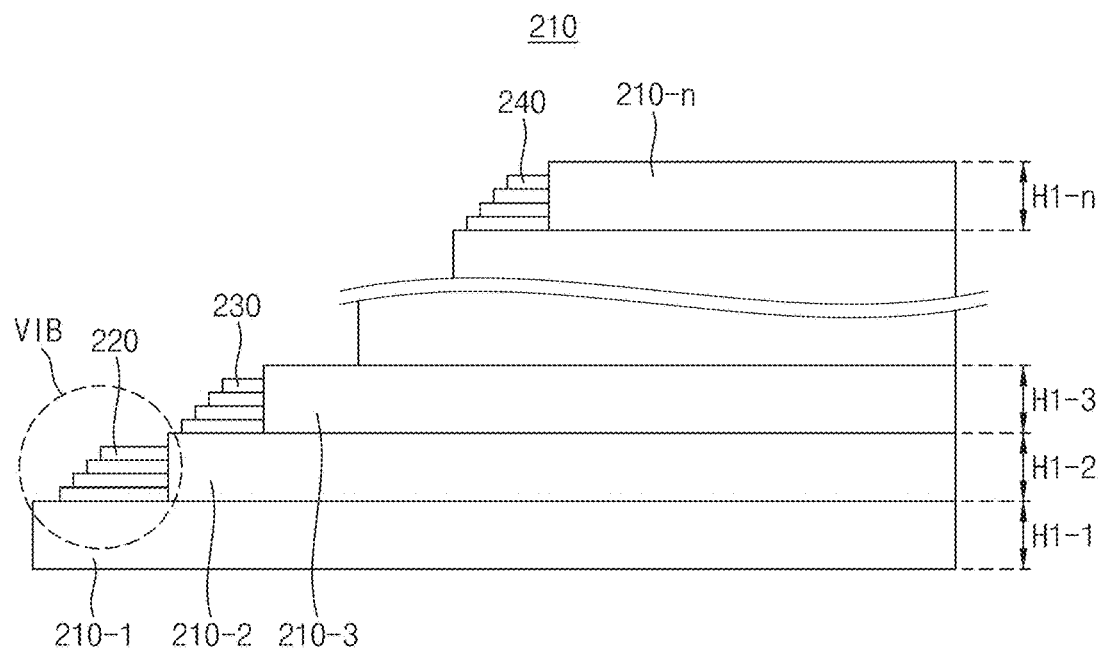
FIGS. 6A and 6B are side views of a focus calibration part, according to an example embodiment of the present disclosure.
Figure 6B:
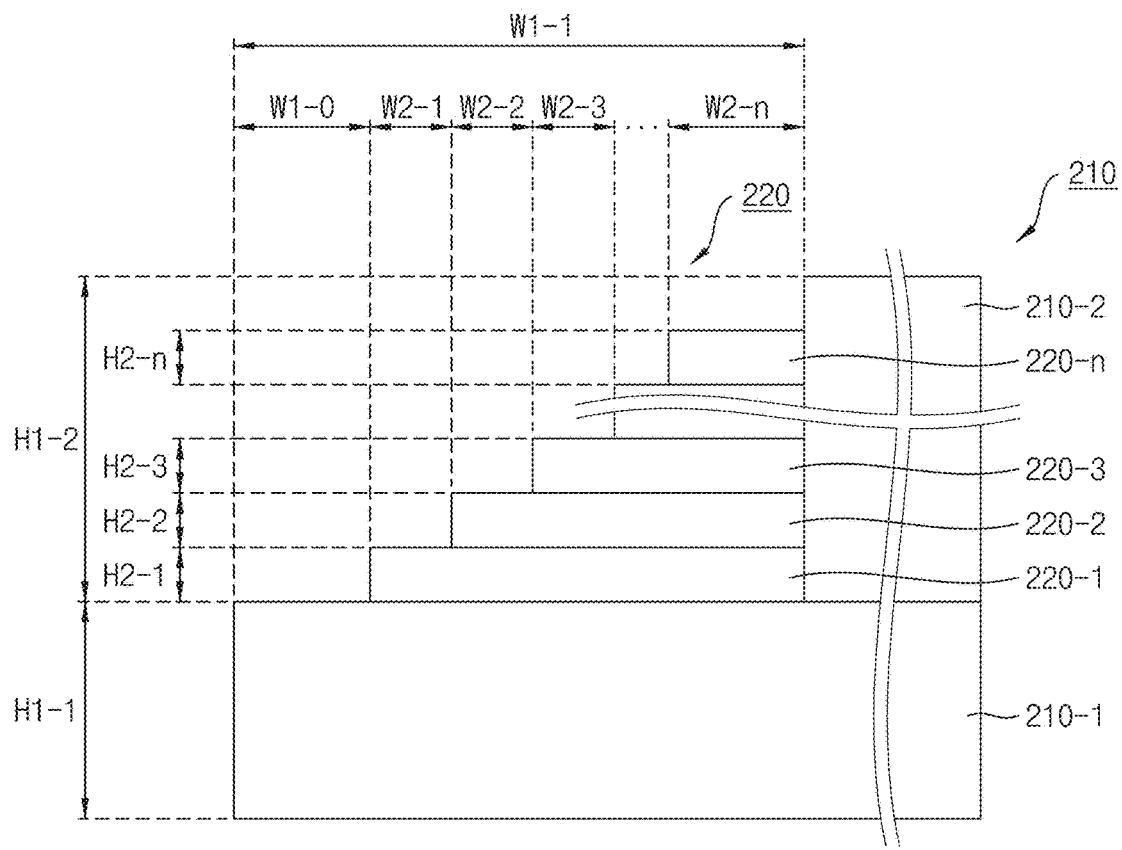

FIGS. 6A and 6B are side views of a focus calibration part, according to an example embodiment of the present disclosure.

Referring to FIG. 6A, first to (n−1)th sub-focus calibration structures 220 to 240 may be disposed on upper surfaces of corresponding ones of a plurality of layers of the focus calibration part 210, respectively. For convenience of description, the focus calibration part 210 may be referred to as a first focus calibration part 210. For example, a first sub-focus calibration structure 220 may be disposed on an upper surface of the first layer 210-1 of the first focus calibration part 210. A second sub-focus calibration structure 230 may be disposed on an upper surface of the second layer 210-2 of the first focus calibration part 210. A (n−1)th sub-focus calibration structure 240 may be disposed on an upper surface of the (n−1)th layer 210-n−1 of the first focus calibration part 210. A height of a sum of the plurality of sub-layers of one of the first to (n−1)th sub-focus calibration structures 220 to 240 may be the same as or substantially similar to a height of a corresponding one of the plurality of layers 220-1 to 220-n of the focus calibration part 210.

FIG. 6B is an enlarged view of a portion VIB of FIG. 6A. Referring to FIG. 6B, the first sub-focus calibration structure 220 may be disposed on an upper surface of the first layer 210-1 of the first focus calibration part 210. The first sub-focus calibration structure 220 may include first to n-th sub-layers 220-1 to 220-n. A partial surface of the upper surface of the first layer 210-1, on which the first sub-focus calibration structure 220 is not disposed, may be exposed. The horizontal width W1-0 of the exposed partial surface of the upper surface of the first layer 210-1 may be the same as the horizontal width W2-n of an upper surface of the nth sub-layer of the first sub-focus calibration structure 220.

The horizontal width W2-1 of the exposed surface of the first upper surface of the first sub-layer 220-1 to the horizontal width of the exposed surface of the (n−1)th upper surface of the (n−1)th sub-layer may be the same. The horizontal width W2-n of the nth upper surface of the n-th sub-layer 220-n of the first sub-focus calibration structure 220 may be different from the horizontal width W2-1 of the exposed surface of the first upper surface of the first sub-layer 220-1. For example, the horizontal width W2-n of the nth upper surface of the n-the sub-layer 220-n may be greater than the horizontal width W2-1 of the exposed surface of the first upper surface of the first sub-layer 220-1.

Figure 7:
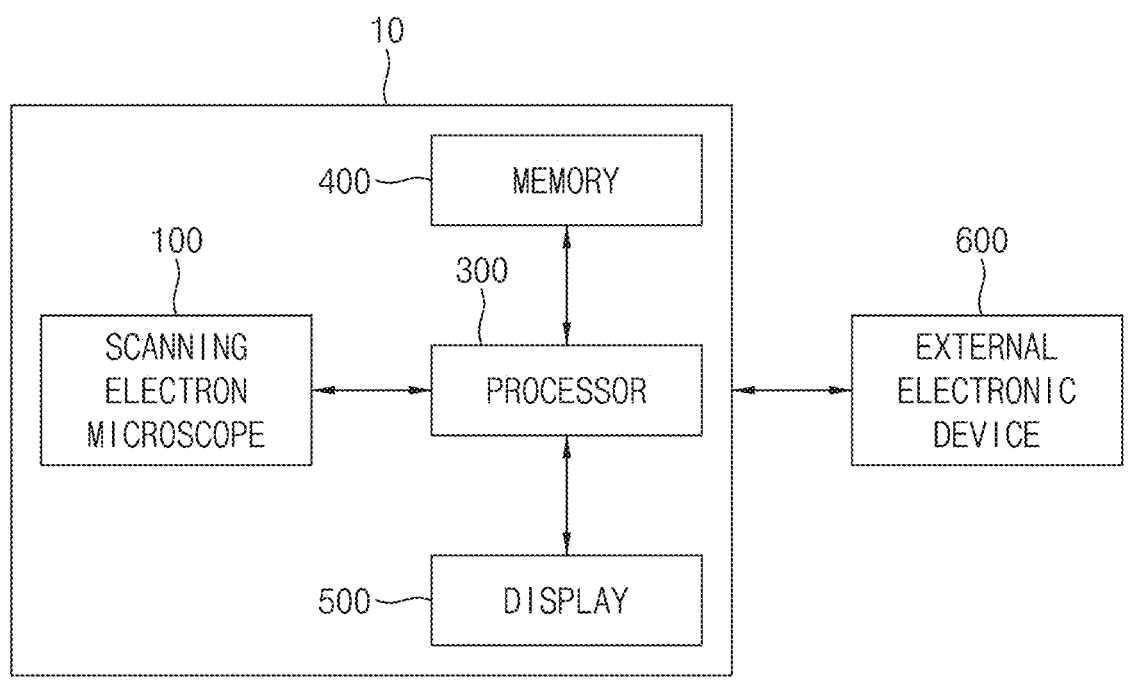
FIG. 7 is a block diagram of a scanning electron microscope apparatus according to an example embodiment of the present disclosure.

FIG. 7 is a block diagram of a scanning electron microscope apparatus 10 according to an example embodiment of the present disclosure.

Referring to FIG. 7, the scanning electron microscope apparatus 10 may include a scanning electron microscope 100, a processor 300, a memory 400, and a display 500.

The scanning electron microscope 100 of FIG. 7 may be the same as or similar to the scanning electron microscope 100 of FIG. 1. The processor 300 may control the overall operation of the scanning electron microscope 100. The memory 400 may store various commands executed by the processor 300. The display 500 may display a 2D image and a 3D image corresponding to a sample photographed by the scanning electron microscope 100.

Figure 8:
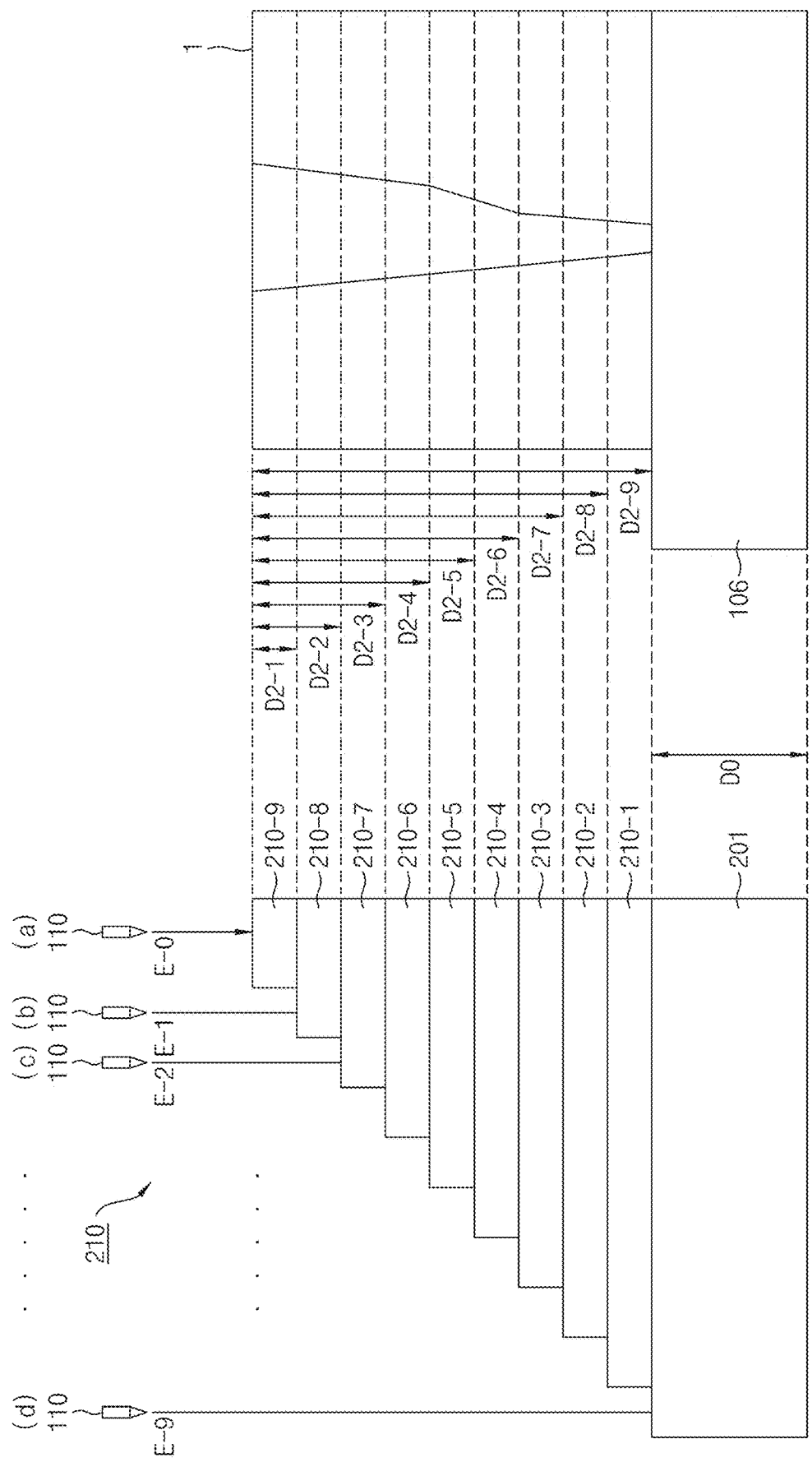
FIG. 8 is a schematic diagram illustrating an operation of determining an offset value depending on the focus of an electron beam using a focus calibration structure of a scanning electron microscope apparatus according to an example embodiment of the present disclosure.

FIG. 8 is a schematic diagram illustrating an operation of determining an offset value depending on the focus of an electron beam using a focus calibration structure of a scanning electron microscope apparatus according to an example embodiment of the present disclosure.

Referring to FIG. 8, the processor 300 may determine an acceleration voltage value applied to the focusing lens 130 of the scanning electron microscope 100 to focus an electron beam on an upper surface of a ninth layer 210-9 of the focus calibration part 210. A point focused on by the electron beam may move depending on the acceleration voltage value.

An electron beam focused on the upper surface of the ninth layer 210-9 may be referred to as a 0th electron beam E-0. An acceleration voltage value applied to the focusing lens 130 in order to scan the 0th electron beam E-0 may be referred to as a 0th acceleration voltage value. For example, a point focused on by the 0th electron beam E-0 may be adjusted to an upper surface of the ninth layer 210-9 according to the 0th acceleration voltage value.

Referring to FIG. 8, the processor 300 may determine an acceleration voltage value applied to the focusing lens 130 of the scanning electron microscope 100 to focus an electron beam on an upper surface of an eighth layer 210-8 of the focus calibration part 210. The electron beam focused on the upper surface of the eighth layer 210-8 may be referred to as a first electron beam E-1. An acceleration voltage value applied to the focusing lens 130 in order to scan the first electron beam E-1 may be referred to as a first acceleration voltage value. For example, a point focused on by the first electron beam E-1 may be adjusted to the upper surface of the eighth layer 210-8 according to the first acceleration voltage value. The upper surface of the eighth layer 210-8 is deeper than the upper surface of the ninth layer 210-9 by a depth of D2-1. In other words, the point focused on by the first electron beam E-1 is deeper than the point focused on by the 0th electron beam E-0 by the depth of D2-1.

Referring to FIG. 8, the processor 300 may determine an acceleration voltage value applied to the focusing lens 130 of the scanning electron microscope 100 to focus an electron beam on an upper surface of a seventh layer 210-7 of the focus calibration part 210. An electron beam focused on the upper surface of the seventh layer 210-7 may be referred to as a second electron beam E-2. An acceleration voltage value applied to the focusing lens 130 in order to scan the second electron beam E-2 may be referred to as a second acceleration voltage value. For example, a point focused by the second electron beam E-2 may be adjusted to the upper surface of the seventh layer 210-7 according to the second acceleration voltage value. The upper surface of the seventh layer 210-7 is deeper than the upper surface of the ninth layer 210-9 by a depth of D2-2. In other words, the point focused on by the second electron beam E-2 is deeper than the point focused on by the 0th electron beam E-0 by the depth of D2-2.

Using the aforementioned method, the processor 300 may determine a third acceleration voltage value for a third electron beam to an eighth acceleration voltage value for an eighth electron beam.

Referring to FIG. 8, the processor 300 may determine an acceleration voltage value applied to the focusing lens 130 of the scanning electron microscope 100 to focus an electron beam on an upper surface of the support layer 201. The electron beam focused on the upper surface of the support layer 201 may be referred to as a ninth electron beam E-9. An acceleration voltage value applied to the focusing lens 130 in order to scan the ninth electron beam E-9 may be referred to as a ninth acceleration voltage value. For example, focus of the ninth electron beam E-9 may be adjusted to a ninth vertical depth D2-9 corresponding to the upper surface of the support layer 201.

For example, each consecutive pair of the first vertical depth D2-1 to the ninth vertical depth D2-9 may has a 1 nm difference. As an acceleration voltage value increases by 5 eV, a depth of focus of an electron beam may increase by 1 nm. For example, with respect to the upper surface of the ninth layer 210-9 of the focus calibration part 210, a depth of focus of an electron beam may increase by 1 nm for each additional acceleration voltage value of 5 eV. That is, the processor 300 may increase the acceleration voltage value by a 5 eV increment in order to focus an electron beam into the semiconductor chip 1 with a depth increment of 1 nm from the upper surface of a semiconductor chip 1.

In this case, the acceleration voltage value corresponding to a focus position of the electron beam may be referred to as a focus offset value. For example, a focus offset value for moving the focus position of the electron beam by 1 nm in a vertical direction may be 5 eV.

Figure 9:
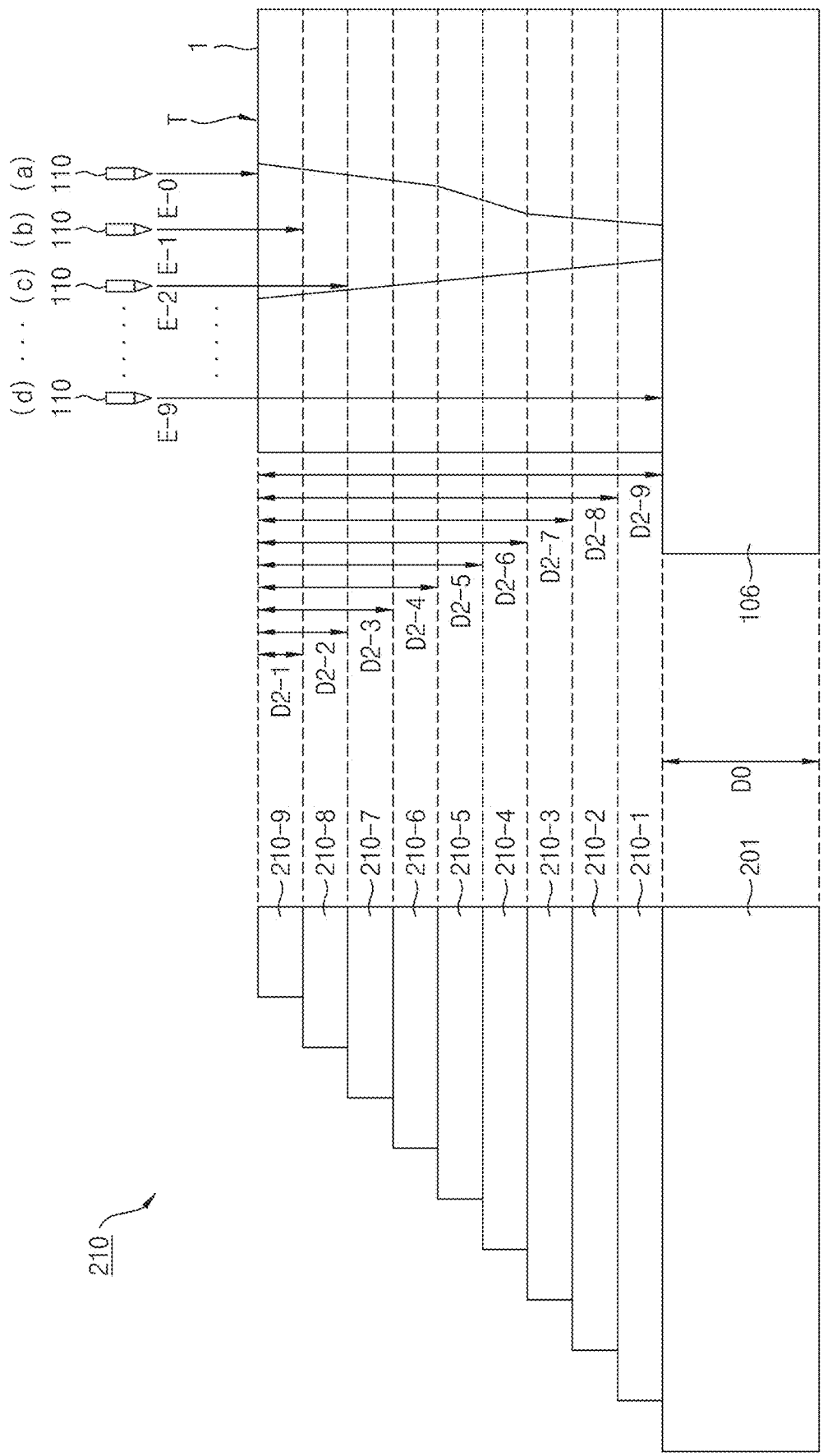
FIG. 9 is a conceptual diagram illustrating an operation of a scanning electron microscope apparatus for controlling the focus of an electron beam incident on a semiconductor device using a focus offset value according to an example embodiment of the present disclosure.

FIG. 9 is a conceptual diagram illustrating an operation of a scanning electron microscope apparatus for controlling the focus of an electron beam incident on a semiconductor device using a focus offset value according to an example embodiment of the present disclosure.

Referring to FIG. 9, the processor 300 may control the scanning electron microscope 100 to focus an electron beam on the upper surface of the semiconductor chip 1. For example, the processor 300 may control the scanning electron microscope 100 to scan the 0th electron beam E-0 having a 0th acceleration voltage value.

For example, the scanning electron microscope 100 may apply the 0th acceleration voltage value under control of the processor 300. The 0th electron beam E-0 may be focused on the upper surface of the semiconductor chip 1 according to the 0th acceleration voltage value generated by the focusing lens 130.

The processor 300 may control the scanning electron microscope 100 to detect a 0th detection electron generated from an upper surface T of the semiconductor chip 1 by the 0th electron beam E-0. For example, the scanning electron microscope 100 may detect the 0th detection electron using the electron detector 150 under control of the processor 300. The processor 300 may generate a 2D image corresponding to the upper surface of the semiconductor chip 1 based on the 0th detection electron.

Referring to FIG. 9, the processor 300 may control the scanning electron microscope 100 to focus an electron beam on a position corresponding to the first vertical depth D2-1 of the semiconductor chip 1. For example, the processor 300 may control the scanning electron microscope 100 to scan the first electron beam E-1 having the first acceleration voltage value.

For example, the scanning electron microscope 100 may apply the first acceleration voltage value to the focusing lens 130 under control of the processor 300. The first electron beam E-1 may be focused to the first vertical depth D2-1 of the semiconductor chip 1 according to the first acceleration voltage value generated from the focusing lens 130.

The processor 300 may control the scanning electron microscope 100 to detect a first detection electron generated at the first vertical depth D2-1 of the semiconductor chip 1 according to the first electron beam E-1. For example, the scanning electron microscope 100 may detect the first detection electron using the electron detector 150 under control of the processor 300. The processor 300 may generate a 2D image corresponding to the first vertical depth D2-1 of the semiconductor chip 1 based on the first detection electron.

Referring to FIG. 9, the processor 300 may control the scanning electron microscope 100 to focus an electron beam on a position corresponding to the second vertical length D2-2 of the semiconductor chip 1. For example, the processor 300 may control the scanning electron microscope 100 to scan the second electron beam E-2 having the second acceleration voltage value.

For example, the scanning electron microscope 100 may apply the second acceleration voltage value to the focusing lens 130 under control of the processor 300. The second electron beam E-2 may be focused to the second vertical length D2-2 of the semiconductor chip 1 according to the second acceleration voltage value generated from the focusing lens 130.

The processor 300 may control the scanning electron microscope 100 to detect the second detection electron generated from the second vertical length D2-2 of the semiconductor chip 1 by the second electron beam E-2. For example, the scanning electron microscope 100 may detect the second detection electron using the electron detector 150 under control of the processor 300. The processor 300 may generate a 2D image corresponding to the second vertical length D2-2 of the semiconductor chip 1 based on the second detection electron.

Using the aforementioned method, the processor 300 may generate a 2D image of the semiconductor chip 1, corresponding to a third vertical depth D2-3, to a 2D image of the semiconductor chip 1, corresponding to an eighth vertical depth D2-8.

Referring to FIG. 9, the processor 300 may control the scanning electron microscope 100 to focus an electron beam on a position corresponding to the ninth vertical depth D2-9 of the semiconductor chip 1. For example, the processor 300 may control the scanning electron microscope 100 to scan the ninth electron beam E-9 having the ninth acceleration voltage value.

For example, the scanning electron microscope 100 may apply the ninth acceleration voltage value to the focusing lens 130 under control of the processor 300. The ninth electron beam E-9 may be focused to the ninth vertical depth D2-9 of the semiconductor chip 1 according to the ninth acceleration voltage value generated from the focusing lens 130.

The processor 300 may control the scanning electron microscope 100 to detect a ninth detection electron generated from the ninth vertical depth D2-9 of the semiconductor chip 1 by the ninth electron beam E-9. For example, the scanning electron microscope 100 may detect the ninth detection electron using the electron detector 150 under control of the processor 300. The processor 300 may generate a 2D image corresponding to the ninth vertical depth D2-9 of the semiconductor chip 1 based on the ninth detection electron.

Figure 10:
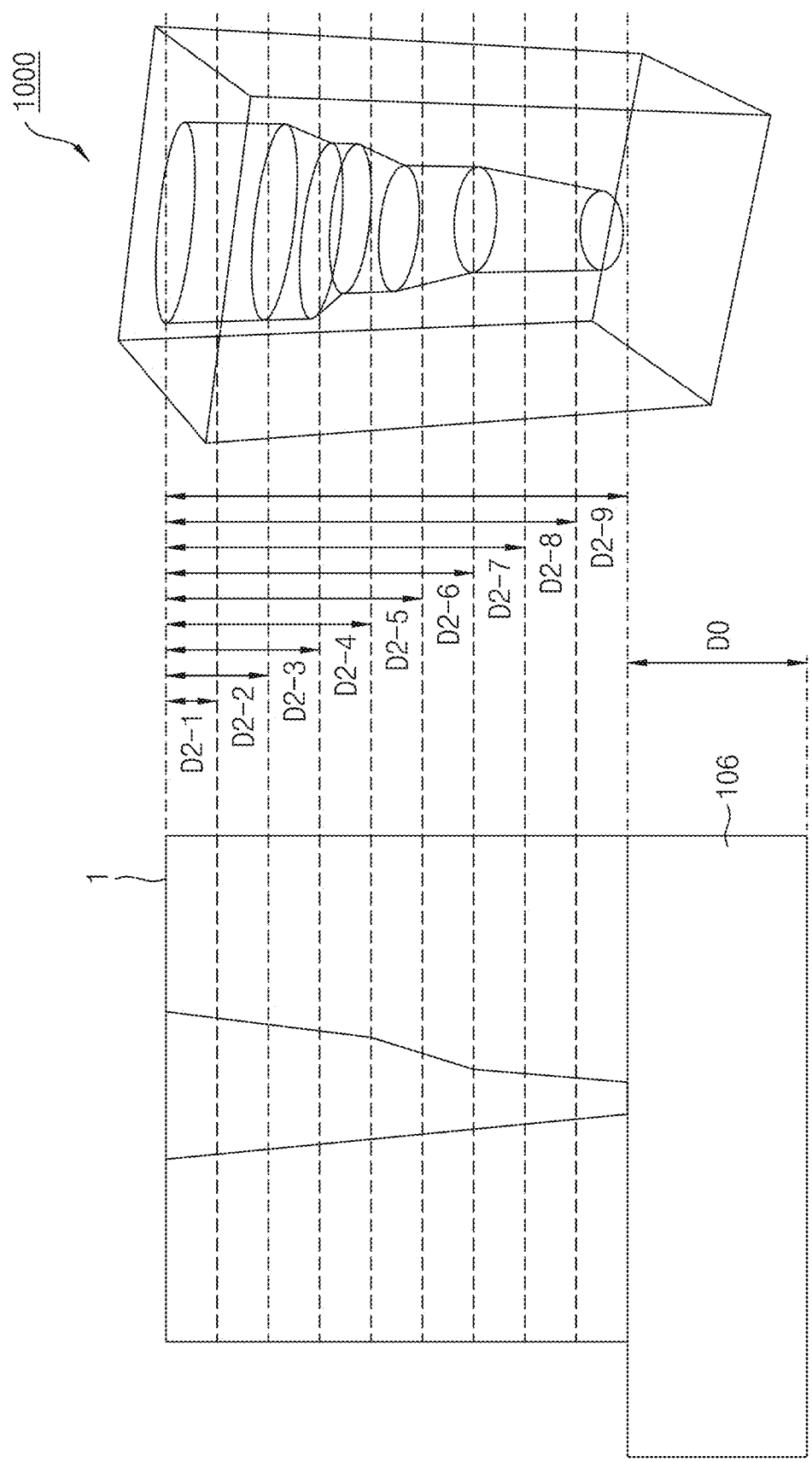
FIG. 10 is a conceptual diagram illustrating an operation of generating a 3D image through a 2D image acquired from a semiconductor chip according to an example embodiment of the present disclosure.

FIG. 10 is a conceptual diagram illustrating an operation of generating a 3D image through a 2D image acquired from a semiconductor chip according to an example embodiment of the present disclosure.

Referring to FIG. 10, the processor 300 may generate a 3D image 1000 from which an internal structure of the semiconductor chip 1 is seen, using a 2D image corresponding to the upper surface of the semiconductor chip 1 and respective 2D images corresponding to the first vertical depth D2-1 to the ninth vertical depth D2-9 of the semiconductor chip 1.

The processor 300 may transmit the generated 2D images to an external electronic device 600. The external electronic device 600 may receive the 2D images from the processor 300. The external electronic device 600 may generate the 3D image 1000 based on the 2D images. The external electronic device 600 may include another processor that is configured to receive the 2D images from the processor 300 and generate the 3D image 1000 based on the received 2D images.

Each of the various processors in this disclosure may include processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

As is apparent from the above description, the present disclosure may analyze a 3D structure of a semiconductor device, without disassembling or destructing the semiconductor device, using a scanning electron microscope apparatus and the aforementioned operating method thereof.

As known by one of ordinary skill in the art, the example embodiments of the inventive concepts described in the present disclosure may be modified and changed over the scope of application fields. Thus, the scope of the claimed idea should not be construed as being limited by the example embodiments described above and is defined by the following claims.

What is claimed is:

1. A scanning electron microscope apparatus comprising:
an electron gun configured to generate an electron beam;
a focusing lens configured to concentrate the electron beam from the electron gun;
an electron detector configured to detect signals emitted from a sample in response to the electron beam incident on the sample;
a stage configured to receive the sample thereon; and
a focus calibration structure on an upper part of the stage, wherein the focus calibration structure includes a plurality of layers.

2. The scanning electron microscope apparatus of claim 1, wherein the plurality of layers are stacked in a staircase shape.

3. The scanning electron microscope apparatus of claim 1, wherein the plurality of layers are stacked in a pyramid shape.

4. The scanning electron microscope apparatus of claim 1, further comprising:
a sub-focus calibration structure on an upper surface of a corresponding one of the plurality of layers.

5. The scanning electron microscope apparatus of claim 4, wherein the sub-focus calibration structure includes a plurality of stacked sub-layers.

6. The scanning electron microscope apparatus of claim 5, wherein a first height of each of the plurality of stacked sub-layers of the sub-focus calibration structure is smaller than a second height of each of the plurality of layers of the focus calibration structure.

7. The scanning electron microscope apparatus of claim 5, wherein a first height of a sum of the plurality of stacked sub-layers of the sub-focus calibration structure is the same as a second height of a corresponding one of the plurality of layers of the focus calibration structure.

8. A scanning electron microscope apparatus comprising:
an electron gun configured to generate an electron beam;
a focusing lens configured to concentrate the electron beam from the electron gun;
an electron detector configured to detect signals emitted from a sample in response to the electron beam incident on a sample;
a stage configured to receive the sample thereon;
a support layer on an upper surface of the stage; and
a focus calibration structure on an upper surface of the support layer.

9. The scanning electron microscope apparatus of claim 8, wherein a height of the support layer is the same as a thickness of a wafer on the upper surface of the stage.

10. The scanning electron microscope apparatus of claim 8, wherein
the focus calibration structure includes a plurality of layers, and
respective heights of the plurality of layers of the focus calibration structure are the same.

11. The scanning electron microscope apparatus of claim 8, wherein
the focus calibration structure includes a plurality of layers, and
respective heights of the plurality of layers of the focus calibration structure are different from each other.

12. An operation method of a scanning electron microscope apparatus, the method comprising:
scanning an electron beam to a focus calibration structure disposed on an upper surface of a stage; and
determining at least one acceleration voltage value for focusing the electron beam on an upper surface of at least one of upper surfaces of a plurality of layers of the focus calibration structure.

13. The method of claim 12, further comprising:
determining an offset value for controlling a focus of the electron beam incident on a semiconductor chip disposed on the upper surface of the stage, based on the determined at least one acceleration voltage value.

14. The method of claim 13, further comprising:
detecting electrons discharged from the semiconductor chip according to the controlled focus of the electron beam.

15. The method of claim 14, further comprising:
generating 2D images representing sectional layers of the semiconductor chip based on the detected electrons, at a depth corresponding to the controlled focus of the electron beam.

16. The method of claim 15, further comprising:
generating a 3D image corresponding to the semiconductor chip based on the 2D images.

17. The method of claim 13, further comprising:
moving the focus of the electron beam in a vertical direction based on the determined at least one acceleration voltage value.

18. The method of claim 13, wherein the determining includes determining the offset value based on a plurality of acceleration voltage values for focusing the electron beam on respective upper surfaces of the plurality of layers.

19. The method of claim 13, wherein the determining includes determining the offset value based on a first acceleration voltage value for focusing the electron beam at a first upper surface of an uppermost layer of the focus calibration structure and a second acceleration voltage value for focusing the electron beam a second upper surface of a lowermost layer of the focus calibration structure.

\* \* \* \* \*